(12) United States Patent
Wang et al.

(10) Patent No.: US 6,338,297 B1
(45) Date of Patent: Jan. 15, 2002

(54) PRECISE AND RAPID POSITIONING MECHANISM FOR STENCIL PRINTING

(75) Inventors: Hwai-Yi Wang, Taichung; Chan-Chung Du, Hsin Chu; Meng-Chun Chen, Shiue Jia Jen, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/578,710

(22) Filed: May 26, 2000

(51) Int. Cl.[7] .............................................. B05C 17/08
(52) U.S. Cl. ..................................... 101/126; 101/127.1
(58) Field of Search ................................ 101/126, 127, 101/127.1, 128.1

(56) References Cited

U.S. PATENT DOCUMENTS

| | | | | |
|---|---|---|---|---|
| 4,463,673 A | * | 8/1984 | Moore | 101/129 |
| 5,699,742 A | * | 12/1997 | Ahrens et al. | 101/486 |
| 5,806,422 A | * | 9/1998 | Hamu | 101/115 |
| 5,819,651 A | * | 10/1998 | Zepic et al. | 101/127.1 |
| 6,113,693 A | * | 9/2000 | Thompson | 118/500 |
| 5,906,158 A1 | * | 5/2001 | Takai | 101/123 |

* cited by examiner

*Primary Examiner*—John S. Hilten
*Assistant Examiner*—Kevin D. Williams
(74) *Attorney, Agent, or Firm*—Dougherty & Troxell

(57) ABSTRACT

A precise and rapid positioning mechanism for stencil printing comprising a stencil, a carrier, a plurality of pins, and a plurality of positioning pins. There are a plurality of same sized pin eyes formed on both the stencil and the carrier respectively at positions facing against each other for interposing the pins therebetween to set the stencil and the carrier. Next, raising the positioning pins by air cylinder supplied from the carrier so as to fit setting holes on the substrate into the corresponding positioning pins thereby firmly securing the substrate. Then afterwards, by imbibing the substrate with vacuum evacuation force from the carrier so as to put down the positioning pins thereby attaching the stencil together with the substrate and trans-printing a desired pattern on the substrate.

1 Claim, 3 Drawing Sheets

PRECISE AND RAPID POSITIONING MECHANISM FOR STENCIL PRINTING

BACKGROUND OF THE INVENTION

1. Field of the Invention

The present invention relates to a positioning mechanism, and more particularly to a precise and rapid positioning mechanism which is used to align accurately a mesh of a stencil to a surface mounting position on a printed circuit board.

2. Description of the Prior Art

In applying conventional surface mount technology (SMT) to stencil printing using solder paste, it depends a lot on an operator's highly sensitive visibility and skillful aligning technique so that a mesh on a stencil can be aligned to a corresponding soldering point on the printed circuit board placed on a carrier for achieving the object of positioning. Moreover, the above described positioning technique further influences both quality of soldering and yield of the product.

In addition to employing the above mentioned method for carrying out the work by experienced operator skillfully with his/her naked eyes, an auxiliary vision system apparatus may be employed to aid the aligning work. However, the object of precise aligning may be achieved with the aid of additional investment of software, hardwares and servo system. As a result, the entire equipment becomes more complicated and the cost is increased as well.

In order to solve the above described problems, the present inventors carried out theoretical studies and simulating experiments. Based on these studies and researches, the present inventors came to propose the present invention.

SUMMARY OF THE INVENTION

It is an object of the present invention to provide a precise and rapid positioning mechanism which can perform printing of a printed circuit board more effectively, accurately and efficiently without need of experienced operators.

It is another object of the present invention to provide a precise and rapid positioning mechanism which, in comparison with a conventional one, is added a movable positioning pin mechanism and two setting holes provided on both the stencil and the carrier for improving the working efficiency and upgrading accuracy.

It is still another object of the present invention to provide a precise and rapid positioning mechanism, which by employing automation control, to facilitate operation, that even an unexperienced operator can carry out his/her work satisfactorily after a short time training.

These and other objects of the present invention are achieved by providing a precise and rapid positioning mechanism for stencil which comprising a stencil, a carrier, a plurality of pins and a plurality of positioning pins. These are a plurality of same sized pin eyes formed on both the stencil and the carrier respectively at positions facing against each other for interposing the pins therebetween to set the stencil and the carrier. Next, raising the positioning pins by air cylinder from the carrier so as to fit setting holes on the substrate into the corresponding positioning pins thereby firmly securing the substrate. Then afterwards, by imbibing the substrate with vacuum evacuation force from the carrier so as to put down the positioning pins thereby attaching the stencil together with the substrate and trans-printing a sodering pattern on the substrate.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENT

Figure 1:
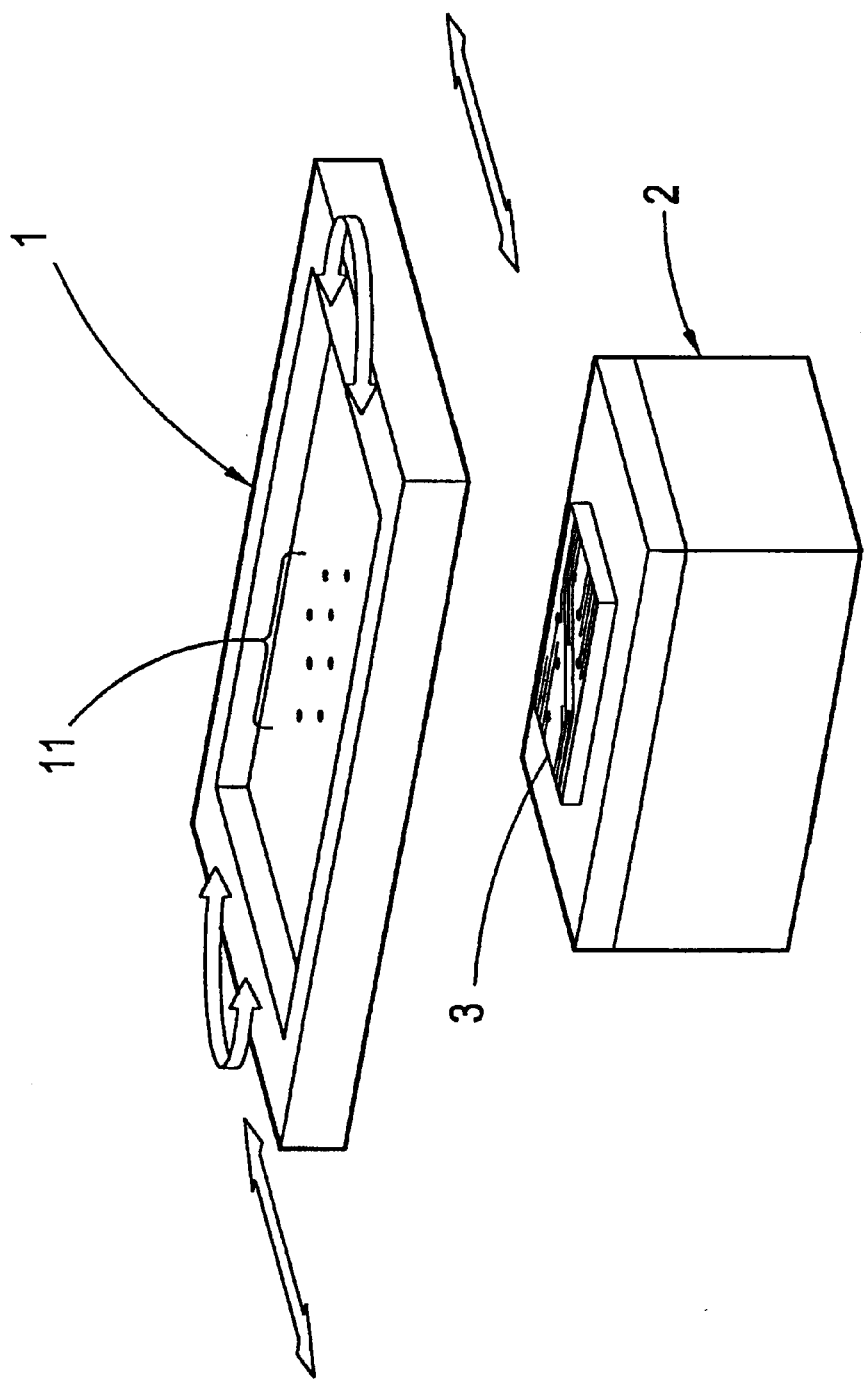
FIG. 1 is a perspective view of a conventional manual positioning mechanism for stencil printing.

Referring to FIG. 1, a perspective view of a conventional manual positioning mechanism for stencil printing is shown thereof. In applying conventional surface mount technology to stencil printing using solder paste, it depends a lot on an operator's highly sensitive visibility and skillful aligning technique so that a mesh 11 on a stencil 1 can be aligned to a corresponding soldering point on a printed circuit board 3 placed on carrier 2 for achieving the object of positioning. However, it is impossible to offset position deviation of the printed circuit board 3 so that both quality of SMD soldering and yield of the product are affected.

Figure 2:
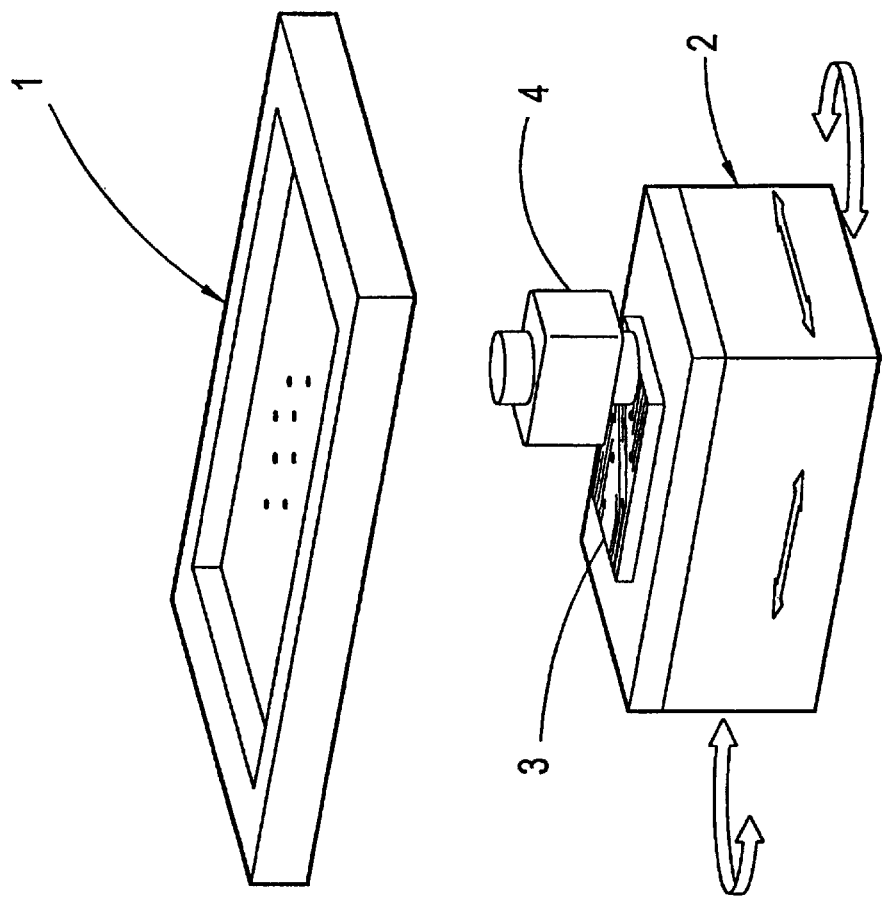
FIG. 2 is a perspective view of a conventional positioning mechanism with vision system aiding apparatus for stencil printing.

The technique used in means shown in FIG. 2 is resembling to that shown in FIG. 1, herein the difference therebetween is found that a vision system aiding apparatus 4 is added between the stencil 1 and the printed circuit board 3 as auxiliary means for positioning. By so, of course, the object of precise positioning may be achieved, but it is necessary to add some auxiliary apparatus such as soft and hard wares and servo rudders. As a result, cost is increased and the mechanism becomes complicated.

Figure 3:
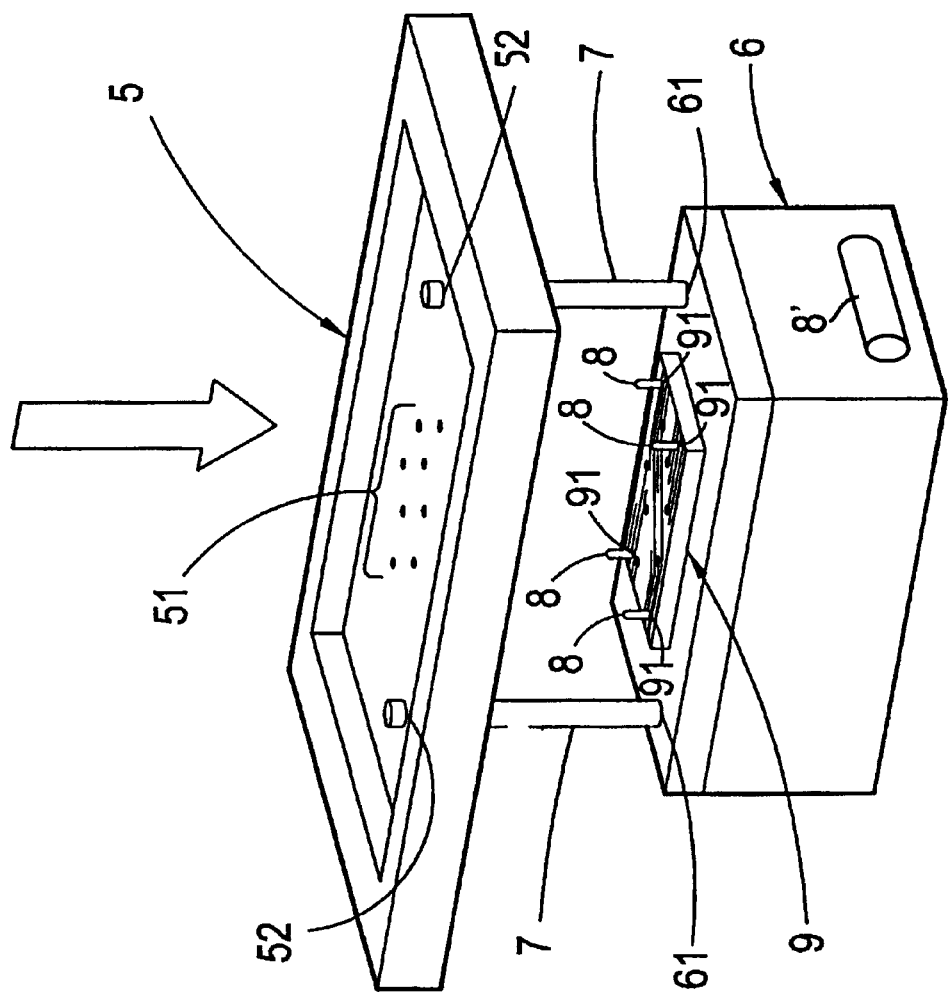
FIG. 3 is a three dimensional view of precise and rapid positioning mechanism for stencil printing according to the present invention.

FIG. 3 is a three dimensional view of the present invention which is disclosed to eliminate the disadvantages inherent to the conventional technique as mentioned above. The effectiveness of the present invention has been authenticated by the present inventors through simulating experiment of the positioning mechanism according to the present invention in rapid printing machine employing Ball Grid Array package (BGA).

As shown in FIG. 3, two or more than two pin eyes 52 and a pattern 51 are formed on a stencil 5, the pattern 51 is composited based on the pin eyes 52 as reference. There are pin eyes 61 formed on the carrier 6, having the same size and number as the pin eyes 52. The pin 7 is inserted into the corresponding pin eye 61 on the carrier 6 through the pin eye 52 on the stencil 5 so that the stencil 5 and the carrier 6 are precisely positioned. After that the stencil 5 and the carrier 6 are securely tightened with each other by proper means so that the pin 7 formerly used for positioning may be removed, then applying tape on the pin eyes 52 of the stencil 5 so as to prevent outflow of solder paste therefrom during printing.

There are a plurality of moval substrate positioning pins which are controlled to ascend and descend by air cylinder 8'. The positioning pins 8 are disposed with respect to the location of setting holes 91 on the substrate 9 as reference. When starting for operation, the positioning pin 8 are in hanging up state by fitting the setting holes 91 on the substrate 9 into corresponding positioning pins 8 so as to surely settle the substrate 9. After that, imbibing the substrate 9 downward with a vacuum evacuation hole not shown the carrier 6 so as to put down the positioning pins 8 thereby attaching the stencil 5 closely together with the substrate 9, and trans-printing a desired pattern 51 on the strate 9 with solder paste either by putting down the stencil 5 or by raising up the carrier 6.

The positioning mechanism of the present invention when compared to conventional manual means for positioning with naked eyes, or with additional vision system aiding apparatus, has the following advantages with respect to equipment cost, working efficiency, accuracy and handleability.

1. As to equipment cost, in the case of adding a vision system aiding apparatus, the equipment cost is increased to several times as much by adding required soft and hard wares and mounting the carrier on X, Y, θ three servo rudders, while in the present invention, only the additional movable positioning pins are required and several setting holes have to be bored on the stencil and the carrier with minor increase of cost.

2. As to working efficiency, manual checking for the stencil position performed by the conventional method spends the longest time, as for production speed, it depends on auxiliary tools employed. In the case of employing vision system aiding apparatus, CCD has to take one picture at a time and report the value of position error to control unit so as to drive the carrier for making error compensation. As for the present invention, both working efficiency for positioning and pattern production speed can be carried out faster than any other conventional method without need for skillful operators.

3. As to accuracy, the present invention provides the most accurate apparatus for positioning as fully described above which need not to be repeated.

4. As to handleability, all conventional positioning means rely on trial and error method which requires experienced operators to perform. However, the positioning mechanism provided by the present invention can be applied to carry out positioning once for all precisely and rapidly without error even by a unexperienced operator.

The invention disclosed herein is well calculated to provide the advantages and features above stated, it will be appreciated that the invention is susceptible to modification, variation and change without departing from the proper scope or fair meaning of the subjoined claims.

What is claimed is:

1. A precise and rapid positioning mechanism for stencil printing comprising:

a stencil with a prescribed figure having a plurality of pin eyes formed at proper positions on a surface thereof;

a carrier having a plurality of pin eyes formed thereon, said pin eyes being the same size as said pin eyes on said stencil and being formed on said carrier at positions corresponding to said pin eyes on said stencil, and a plurality of holes for vacuum evacuator being provided on a surface of said carrier;

a plurality of pins interposed between said stencil and said carrier, said pins being inserted into said pin eyes of said stencil and said pin eyes of said carrier to precisely and fixedly position said stencil and said carrier;

an air cylinder for controlling a flow of pressurized air to said plurality of vacuum evacuator holes on said carrier;

a plurality of positioning pins movably provided on said carrier for ascending and descending according to said flow of pressurized air; and a substrate having a plurality of setting holes for fitting onto said positioning pins to position and secure the substrate to the carrier;

wherein said positioning pins are raised from said carrier by said flow of pressurized air, the setting holes on said substrate are fitted onto said positioning pins to position and secure said substrate to said carrier, said substrate is imbibed with said vacuum evacuation holes on said carrier by said flow of pressurized air and said positioning pins are descended thereby attaching said stencil together with the substrate and transprinting said prescribed figure on the substrate.

* * * * *